United States Patent [19]

Iwami et al.

[11] Patent Number: 5,164,037
[45] Date of Patent: Nov. 17, 1992

[54] APPARATUS FOR REMOVING SEMICONDUCTOR DEVICES FROM HIGH DENSITY MULTICHIP MODULES

[75] Inventors: Craig S. Iwami, Dana Point; Edward J. Onda, Hermosa Beach, both of Calif.

[73] Assignee: Hughes Aircraft Company, Los Angeles, Calif.

[21] Appl. No.: 697,658

[22] Filed: May 8, 1991

[51] Int. Cl.⁵ .............................................. B32B 35/00
[52] U.S. Cl. ..................................... 156/584; 156/94; 29/762; 219/230; 228/264
[58] Field of Search .......................... 156/94, 344, 584; 29/402.03, 762, 764, 827; 228/191, 264, 6.2, 44.7, 180.2; 174/52.4; 219/229, 230, 241

[56] References Cited

U.S. PATENT DOCUMENTS

| | | | |
|---|---|---|---|
| 3,710,432 | 1/1973 | Dieffenbacher et al. | 228/191 |
| 4,828,162 | 5/1989 | Donner et al. | 228/191 X |
| 4,934,582 | 6/1990 | Bertram et al. | 228/191 |
| 4,954,453 | 9/1990 | Venutolo | 29/762 X |
| 5,072,874 | 12/1991 | Bertram et al. | 228/264 |

OTHER PUBLICATIONS

"A Review of Repairable Die Attach for CuPI MCM", by Thom A. Bishop, pp. 77–89, 1990.

*Primary Examiner*—David A. Simmons
*Assistant Examiner*—Mark A. Osele
*Attorney, Agent, or Firm*—Terje Gudmestad; W. K. Denson-Low

[57] ABSTRACT

Method and apparatus for vertically removing semiconductor integrated circuits (91) from high density multichip hybrid microcircuits without interfering with close proximity neighboring devices. An integrated circuit (91) is vertically removed by simultaneously applying tensile and torsional forces thereto. By using the present invention to transfer some of the tensile force torsionally, high density multilayer interconnect substrates (93) survive the rework process without damage. The present invention employs techniques which allow for accurate and repeatable removal of closely spaced integrated circuit devices. Removal of an integrated circuit (91) is accomplished by bonding a special thermode device (70, 70') directly to the integrated circuit (91) using a thermoset, or a thermoplastic, die attach material (90). Once the thermode (70, 70') has been attached, tensile and torsional forces are applied to the integrated circuit (91) through the attached thermode (70, 70'). Additionally, the method and apparatus of the present invention may be used with precision measuring equipment to accurately evaluate and measure adhesional strength over large surface areas of devices such as die mounting pads on high density multichip interconnect substrates.

3 Claims, 2 Drawing Sheets

APPARATUS FOR REMOVING SEMICONDUCTOR DEVICES FROM HIGH DENSITY MULTICHIP MODULES

BACKGROUND

The present invention relates generally to integrated circuit die removal apparatus and methods, and more particularly to die removal apparatus and methods for use with semiconductor integrated circuit devices that are attached to high density multilayer interconnect hybrid packages.

The high cost of the parent substrate and integrated circuit devices makes repair and rework of faulty multichip modules a necessity in order to reduce assembly cost and improve hybrid and multichip module yield. Successful die removal is a function of the die attach material used during assembly, the parent substrate metallization system, and the removal/repair technique utilized. A typical ceramic substrate has a gold metallization layer disposed thereon and has a semi-conductor integrated circuit device fastened thereto by a body of epoxy. This sandwich structure provides an epoxy/metallization interface, and an epoxy/device interface. Rework is relatively easy for small to moderate size integrated circuits up to about 100 mils square that are moderately spaced on ceramic substrates. Now, however, with the advent of high density multichip modules consisting of multilayer thin film substrates using thin polyimide dielectric films and thin sputtered aluminum or copper metallization, new and more difficult device attachment and rework issues have presented themselves. The polyimide dielectric films may be on the order of 5 to 15 micrometers thick, and the metallization films may be on the order of 2 to 5 micrometers thick. Additionally, spacings between semiconductor integrated circuit devices are commonly between 0.100 and 0.250 of an inch. High density multichip interconnect technology has reduced device spacing to a point where reworking of hybrids is now more difficult than ever. Spacing of high density multichip interconnect technology devices has decreased by as much as a factor of ten.

Some high density multichip interconnect substrates may incorporate as many as eight metallization layers. A substrate has a metallization layer on top of which is a polyimide layer. The polyimide layer has a metallization layer on top of it and a semiconductor integrated circuit device fastened thereto by epoxy. Typically, this type of construction is referred to as a high density multichip interconnect substrate. Unlike typical thick/thin film metallized ceramic substrates, failure of the high density multilayer interconnect substrate metallization occurs at much lower strengths. Typically, on ceramic metallization systems, failure during shear and tensile testing occurs at the epoxy/metallization interface, epoxy body, or epoxy/device interface. Failures to high density multilayer interconnect systems, however, can occur within the polyimide dielectric or at the metallization/polyimide interface, which typically has much less adhesion strength than the device attachment material, device, or substrate/epoxy interface.

There are several widely used techniques for the removal of faulty components. Four such techniques are the simple die shear technique, the dual blade die twist off technique, the tensile die pull technique, and the hot gas/tweezer technique. The transactions of the 1990 International Electronics Packaging Society (IEPS) includes a technical paper that surveys the field of removal of semiconductor integrated circuit devices from multi-chip modules. The paper discusses die shear, dual blade twist off, tensile die pull, and hot gas/tweezer techniques of die removal. The paper appears at pages 77-89, and is entitled "A Review of Repairable Die Attach For CuPI MCM". The author is Thom A. Bishop of Microelectronics and Computer Technology Corporation (MCC), 12100-A Technology Blvd., Austin, Tex. 78727. The die shear method is not useable where close proximity component spacing is encountered because of the blade interference with adjacent components and potential damage to neighboring devices from the device being removed. The dual blade die twist off removal method is not compatible with close die spacing because of blade interference with adjacent components. The die pull removal technique is quite different from the die shear and twist off method. A pull stud or peg is glued to the top of the defective die and the substrate is mounted and clamped rigidly. The stud is gripped by a second set of clamps and is pulled vertically away from the substrate. The stud and die are then removed from the substrate. Tensile pull can be performed at any temperature, substrate and die permitting, and is compatible with close die spacing.

The hot gas/tweezer removal method is a high temperature process and is not compatible with closely spaced large devices. Additionally, this technique cannot generate sufficient forces to remove large area devices using tweezers. Another disadvantage of the hot gas/tweezer method is that when large area devices (as large as 0.580 inches square) are being removed from a high density multichip module substrate, fracturing of the device, or splintering, may occur. Splintering is most apt to occur when large area devices are removed by mechanical means such as tweezers. When splintering occurs, silicon splinters become lodged between interconnects of neighboring devices.

Of the four removal methods just described, none have proven to be completely satisfactory for removing semiconductor integrated circuit devices from crowded high density multichip modules comprising multilayer thin film substrates using thin polyimide dielectric films and thin sputtered aluminum or copper metallization.

Accordingly, it would be desirable to provide a method and apparatus that is adapted to remove semiconductor integrated circuit devices from high density multilayer interconnect substrates without damage to other devices on the substrate.

SUMMARY OF THE INVENTION

In order to overcome the limitations of conventional die removal equipment, the present invention comprises a method and apparatus that is adapted to remove damaged semiconductor integrated circuit devices vertically from a high density multichip hybrid microcircuit module without interfering with close proximity neighboring devices. A device is vertically removed by simultaneously applying tensile and torsional forces to the device. By using the present invention to transfer some of the tensile force torsionally, high density multichip interconnect substrates survive the rework process without damage. The present invention allows an operator to remove devices from the delicate high density multilayer interconnect substrates, without fear of damaging materials, or neighboring devices. Without the equipment of the present invention, rework time is increased, and losses due to rework are also increased.

Additionally, the method and apparatus of the present invention may be used with precision measuring equipment to accurately evaluate and measure adhesional strength over large surface areas of substrates such as die mounting pads on high density multichip interconnect substrates. Other measuring equipment such as the Sebastian pull tester can only monitor pure tensile force in a room temperature environment.

The present invention employs techniques which allow for accurate and repeatable removal of closely spaced integrated circuit devices. Removal of an integrated circuit device is accomplished by attaching a special tool directly to the device using a thermoset, or a thermoplastic die attach material. Once the device has been attached, tensile and torsional forces may be applied to the device simultaneously or incrementally.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 2:
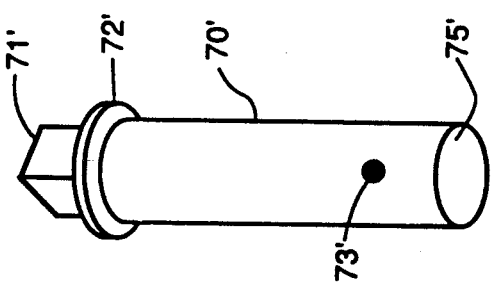
FIG. 2 is a perspective view of a second embodiment of a thermode in accordance with the present invention.
Figure 1:
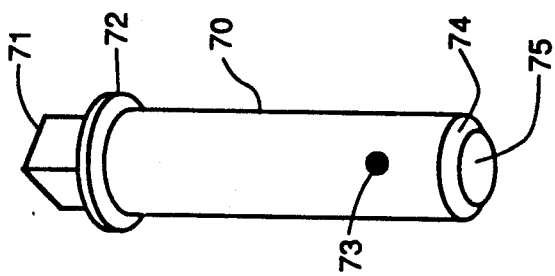
FIG. 1 is a perspective view of a first embodiment of a thermode in accordance with the present invention.

Referring now to FIG. 1, an apparatus for removing semiconductor chips from a substrate is shown called a thermode 70 which is adapted to be mounted in a precision carriage. The thermodes of the present invention are adapted to be used in an apparatus such as is disclosed in a related patent application assigned to the assignee of the present patent application, Ser. No. 07/698,747, filed May 8, 1991, for "Advanced Die Removal and Torque Shear Station," by Edward J. Onda and Craig S. Iwami. The thermode 70 may be of a one piece construction having a square shank or grasping portion 71 at the top above a retaining collar 72, and having an elongated cylindrical body below the retaining collar 72. The grasping portion 71 may be any convenient shape, such as a square, triangular or cylindrical shape that may be easily secured. Near the tip, the thermode 70 is provided with an opening 73 to permit the passage of gas such as air or nitrogen used for cooling. Some thermodes may have a cylindrical tip larger than the cylindrical body to match the large device being removed. The embodiment shown in FIG. 1 has a bevel 74 or annular chamfer at the bottom that provides a flat circular surface 75 which may be 0.380 of an inch in diameter, for example. FIG. 2, wherein like or similar parts are designated by the same but primed reference numbers, shows a perspective view of another embodiment of a thermode 70' that has a straight cylindrical body all the way to the bottom and has a flat circular surface 75' 0.560 inch in diameter, for example.

Figure 4:
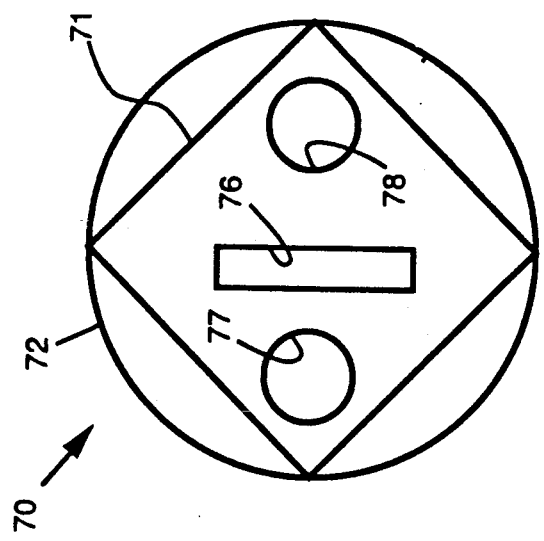
FIG. 4 is an enlarged top view of the thermodes of FIGS. 1, 2 and 3 indicating the provisions for heating and cooling thereof.
Figure 3:
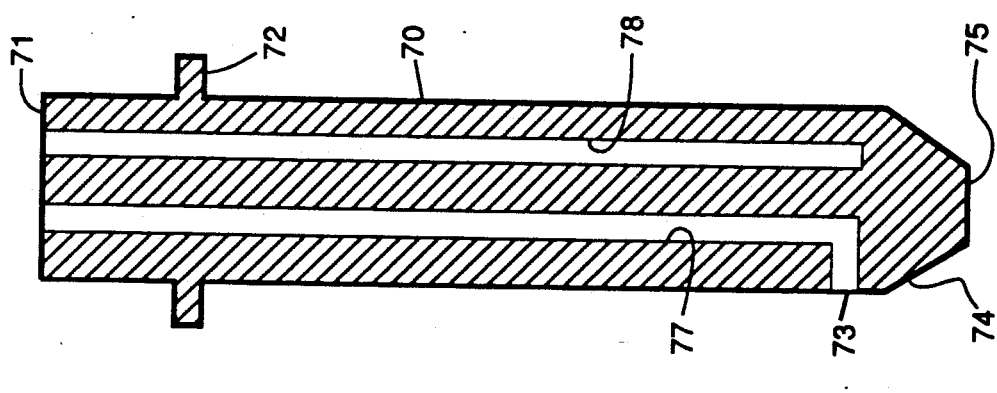
FIG. 3 is a view of the thermode of FIG. 1 indicating the internal construction thereof.

FIG. 4 is an enlarged top plan view of the thermode 70 illustrating the arrangements provided for heating and cooling thereof. FIG. 4 shows a plan view of the square shank or grasping portion 71 at the top of the thermodes 70, 70' of FIGS. 1, 2 and 3. The grasping portion 71 provides fixed mounting in a precision carriage. The grasping portion 71 is provided with a rectangular opening 76 leading into an elongated rectangular chamber for receiving a strip heater. Typically, this elongated rectangular chamber may be 0.044×0.221×3.25 inches deep. The rectangular opening 76 is not centered in the body of the thermode 70, but is displaced slightly to one side. The thermode 70 is provided with two round holes 77, 78, one on each side of the rectangular opening 76. Typically, these round holes 77, 78 are each 0.10 inch in diameter, and 3.25 inches deep. FIG. 3 is a side view of the thermode 70 shown in FIG. 1 taken through the center of the thermode 70. The elongated rectangular chamber to receive the strip heater is not shown in FIG. 3, but the two round holes 77, 78 are shown. It will be seen that one round hole 78 terminates as a blind hole close to the end or flat circular surface 75 of the thermode. This hole 78 is used to receive a thermocouple. The other hole 77 connects to the opening 73 used for passage of a cooling gas.

Figure 6:
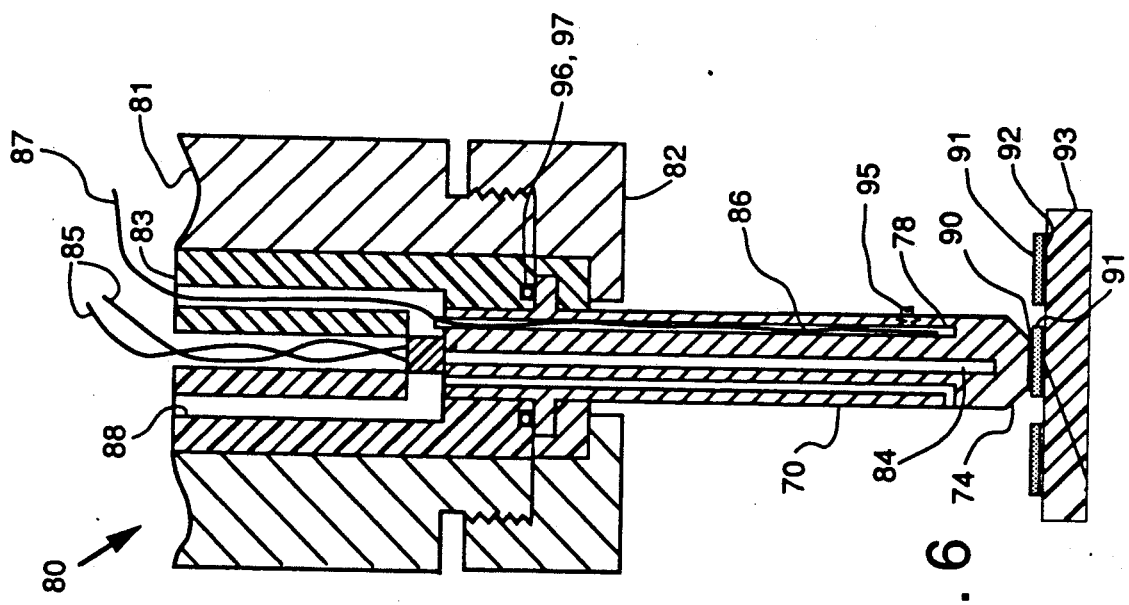
FIG. 6 is a side cross-sectional view of the thermode of FIG. 5 shown rotated ninety degrees with respect to the orientation shown in FIG. 5.
Figure 5:
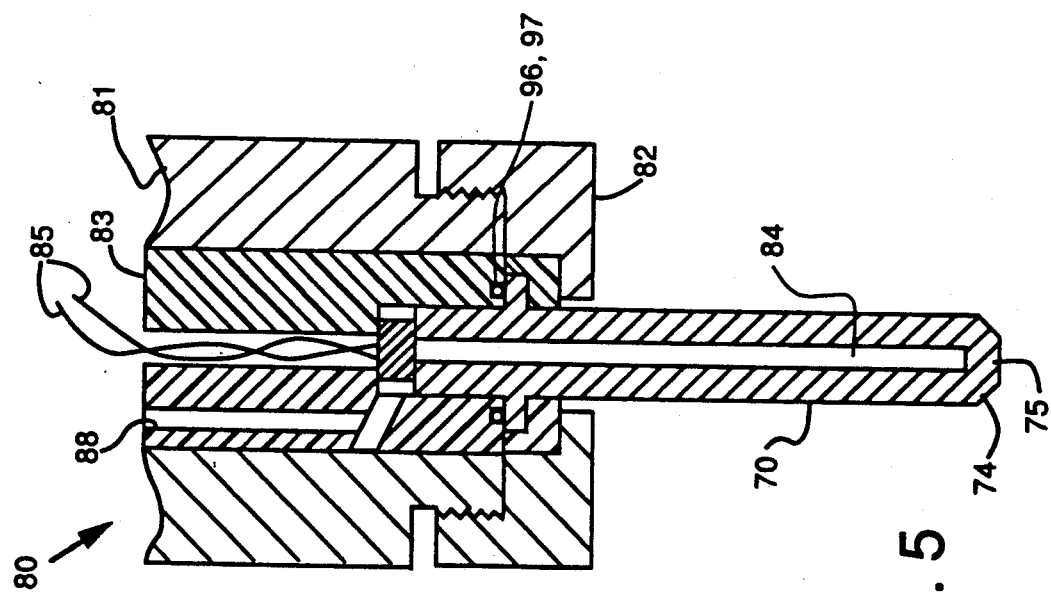
FIG. 5 is a side cross-sectional view of the thermode of FIG. 1 mounted in a collar and retaining cap.

FIGS. 5 and 6 show the thermode 70 mounted in an insulated carriage 80. FIGS. 5 and 6 are cross-sectional side views having the carriage 80 broken away. FIG. 5 is rotated 90 degrees with respect to FIG. 6. The thermode 70 seats into an opening provided in a collar 81, and butts against an O-ring 96 that is retained in an annular groove 97, and a retaining cap 82 seats against the retaining collar 72 of the thermode 70 and holds it in place. A thermal insulating material 83 is disposed around the thermode 70 within the collar 81 and the retaining cap 82 of the carriage 80. A strip heater 84 extends down the center of the thermode 70 and is seen broadside on in FIG. 5, and edge on in FIG. 6. A pair of wires 85 to provide heater power extend away form the strip heater 84. A thermocouple 86 extends down one of the round holes 78 and has connecting wires 87 extending away therefrom. If desired, provisions may be made for holding the thermocouple 86 in its hole 78 by means of a set screw 95. An entrance orifice 88 is provided in the insulating material 83 above the thermode 70 to provide a passage for a cooling gas such as air or nitrogen ($N_2$) to circulate down the cooling hole 77 in the thermode 70 and exit via the opening 73 provided therefor.

In FIG. 6, the thermode 70 is glued or otherwise adhered to a defective semiconductor integrated circuit device 91 using an adhesive 90 having a greater adhesion strength at elevated temperatures than an adhesive 92 used to attach the semiconductor integrated circuit device 91 to a substrate 93. Other semiconductor devices 91 closely spaced from the defective semiconductor device 91 are shown secured to the substrate 93 by adhesive 92.

The method and apparatus of the present invention allows device removal to be performed vertical of the device, providing access to closely spaced devices that are typical with high density multichip interconnect circuitry. With the thermode of the present invention, torque, tensile forces and temperature can be simultaneously applied, controlled and monitored. The amount of tensile forces applied for a square chip, 400 mils on each side is in the range of 10 pounds, while the amount of torque in terms of shear is about 5 inch pounds. The typical temperature range of the thermode 70, 70' is approximately 250-350 degrees Celsius, while the hot plate temperature is approximately 150 degrees Celsius depending upon the adhesives used to secure the device to the substrate. The combination of force in torque and tensile significantly decreases the ultimate tensile load required for removal of devices compared to force in tensile applied alone. As a result, consistent and repeatable device repair procedures may be performed.

By providing simultaneous loading in tensile and torque, reworking thin-film multilayer substrates using MIL STD 883, Method 5011 certified epoxy materials can be successfully achieved. Devices as large as 0.580 inch per side can be removed as many as five times without affecting the integrity of the underlying circuitry or neighboring devices and interconnects. Devices can be removed with spacing between chips as close as 0.020 inch. Remaining epoxy residues after removal are reduced to less than 20% of the total area of the die attach bonding pad.

Thus, there has been described a method and apparatus for removing semiconductor integrated circuit devices from high density multichip modules. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. Apparatus for removing semiconductor integrated circuit devices from high density multichip substrates to which they are adhered, said apparatus comprising:

a thermode comprising an elongated cylindrically shaped member with two ends, one end having a grasping portion, the other end having an attachment end portion adapted for attachment to the semiconductor integrated circuit device with a glue having greater adhesion strength at elevated temperatures than adhesive used to adhere the semiconductor integrated circuit device to the substrate the thermode further having three elongated holes therein opening to and extending from the grasping portion end substantially the length of the elongated cylindrically shaped member, one of said holes opening through the side wall thereof near the attachment end portion, the other two holes being closed at their respective terminating points;

first heating means inserted within one of the said two elongated closed holes for heating the device from above using the thermode; and second heating means for heating the semiconductor integrated circuit device from below;

temperature sensing means inserted in the other of said two elongated closed holes;

forced application means for applying forces in torque and tensile to the thermode and the semiconductor integrated circuit device in order to detach the semiconductor integrated circuit device from the substrate.

2. The apparatus of claim 1 wherein the temperature sensing means comprises a thermocouple.

3. The apparatus of claim 2 wherein the housing has a substantially flat end that is adapted to be adhered to an integrated circuit device.

* * * * *